United States Patent [19]

Flemish et al.

[11] Patent Number: 5,256,595
[45] Date of Patent: Oct. 26, 1993

[54] METHOD OF GROWING DEVICE QUALITY INP ONTO AN INP SUBSTRATE USING AN ORGANOMETALLIC PRECURSOR IN A HOT WALL REACTOR

[75] Inventors: Joseph R. Flemish, Westfield; Kenneth A. Jones, Brick; Vladimir S. Ban, Princeton, all of N.J.

[73] Assignee: The United States of America as represented by the Secretary of the Army., Washington, D.C.

[21] Appl. No.: 19,508

[22] Filed: Feb. 19, 1993

[51] Int. Cl.⁵ .......................................... H01L 21/205
[52] U.S. Cl. ...................................... 437/104; 437/133; 148/DIG. 110
[58] Field of Search ............... 437/133, 104, 107, 138; 156/613; 148/DIG. 110

[56] References Cited

U.S. PATENT DOCUMENTS

| | | | |
|---|---|---|---|
| 4,645,687 | 2/1987 | Donnelly et al. | 148/DIG. 93 |
| 4,716,130 | 12/1987 | Johnston, Jr. et al. | 437/104 |
| 4,817,557 | 4/1989 | Diem et al. | 118/719 |
| 5,036,022 | 7/1991 | Kuech et al. | 437/81 |

FOREIGN PATENT DOCUMENTS

| | | | |
|---|---|---|---|
| 55-99717 | 7/1980 | Japan | 437/133 |
| 57-149722 | 9/1982 | Japan | 437/133 |
| 58-184721 | 10/1983 | Japan | 437/133 |

OTHER PUBLICATIONS

Ban, V. S., et al., "High Rate Epitaxial . . . ", *Appl. Phys. Lett.*, 62(2), Jan. 11, 1993, pp. 160–162.
Wolf, S., et al., Silicon Processing, 1986, Lattice Press, pp. 164–174.

*Primary Examiner*—T. N. Quach
*Attorney, Agent, or Firm*—Michael Zelenka; Roy E. Gordon

[57] ABSTRACT

An organometallic precursor as for example trimethyl indium (TMI) is co-injected with HCl into a hot wall reactor to form volatile InCl, and PH$_3$ is used as the phosphorus source. Layers of InP are grown at approximately 8 μm/hr with excellent morphology and good electrical properties. Hall measurements at 77K show background n-type conductivity with $n = 7 \times 10^{15}/cm^3$ and $\mu^S$ 34,000 cm$_2$/V-s. The method is capable of growing ternary and quaternary heterostructures with thin layers and abrupt junctions.

2 Claims, 2 Drawing Sheets

METHOD OF GROWING DEVICE QUALITY INP ONTO AN INP SUBSTRATE USING AN ORGANOMETALLIC PRECURSOR IN A HOT WALL REACTOR

GOVERNMENT INTEREST

The invention described herein may be manufactured, used, and licensed by or for the Government for governmental purposes without the payment to us of any royalties thereon.

BACKGROUND OF THE INVENTION

I. Field of the Invention

This invention relates in general to a method of growing heterostructures with abrupt junctions using an organometallic precursor in a hot wall reactor and in particular to a method for the epitaxial growth of InP by reacting trimethyl indium (TMI) with HCl in a hot-wall reactor.

II. Description of the Prior Art

Organometallic vapor phase epitaxy (OMVPE) has been used extensively in the epitaxial growth of III-V layers for electronic and optoelectronic device applications, because it has demonstrated the ability to produce high quality heterostructures with abrupt interfaces. Because most organometallic precursors decompose or react with group V hydrides at temperatures above 200° to 300° C., cold-wall reactors have been typically used to prevent depletion of the reactants before reaching the substrate. In epitaxial techniques such as hydride or chloride VPE, hot-wall reactors have been used, and the group III species have been transported to the substrate as volatile monochlorides. These hot wall reactors have been used to grow high quality material, but growth of heterostructures with thin layers and abrupt junctions have been limited by the difficulty in changing the flow rates of group III chlorides that originate from gas-solid reactions in separate zones upstream in the reactor. Compared to the OMVPE, potential advantages of the chloride and hydride techniques include greatly reduced V/III partial pressure ratios, greater control and uniformity of substrate temperature, higher growth rates, greater ability for selective growth, and the potential for higher through-put.

SUMMARY OF THE INVENTION

The general object of this invention is to provide a method for the epitaxial growth of III-V layers for electronic and optoelectronic device applications. A further object of the invention is to provide such a method that demonstrates the capability of uniform and efficient growth rates of over 5 $\mu$m/hr. A still further object of the invention is to provide such a method that uses gaseous input reactants suitable for fast-switching that makes possible the growth of thin layers with abrupt junctions. Another object of the invention is to provide such a method that uses a hot-wall reactor to minimize carbon incorporation, promote high through-put, and allow growth of high-quality phosphorus based compounds. Another object of the invention is to provide such a method that uses low ratios of group V to group III reactants in the vapor-phase to avoid excessive use of toxic gases such as arsine and phosphine. Another object of the invention is to provide a method that has an enhanced ability to perform selective area epitaxy attributable to the chlorine based chemistry of the process. A particular object of this invention is to provide a method of growing device quality InP in a growth system using an organometallic precursor in a hot-wall reactor.

It has now been found that the aforementioned objects can be attained and the epitaxial growth of InP provided for by coinjecting TMI with HCl into a hot-wall reactor to form volatile InCl using $PH_3$ as the phosphorus source.

Layers of InP can be grown at approximately 8 $\mu$m/hr with excellent morphology and good electrical properties. Hall measurements at 77K show background n-type conductivity with $n = 7 \times 10^{15}/cm^3$ and $\mu = 34{,}000$ cm$^2$/V-s. This technique is capable of growing ternary and quaternary heterostructures with thin layers and abrupt junctions.

DESCRIPTION OF THE DRAWING

Referring to FIG. 1, a fused silica (fused quartz) reactor tube, 10 is housed in a multiple temperature zone furnace, 12 and is surrounded by a thermally insulating material 13. In addition to a loading chamber, 14, four separate zones exist within the reactor. These zones are a preheat zone, 16 at a first temperature range of 500° C. to 750° C., a deposition zone, 18 at a second temperature range of 500° C. to 750° C., a mixing zone, 20 at a third temperature range of 500° C. to 750° C. and a zone 22 at a fourth temperature range of 50° C. to 300° C.

Figure 1:
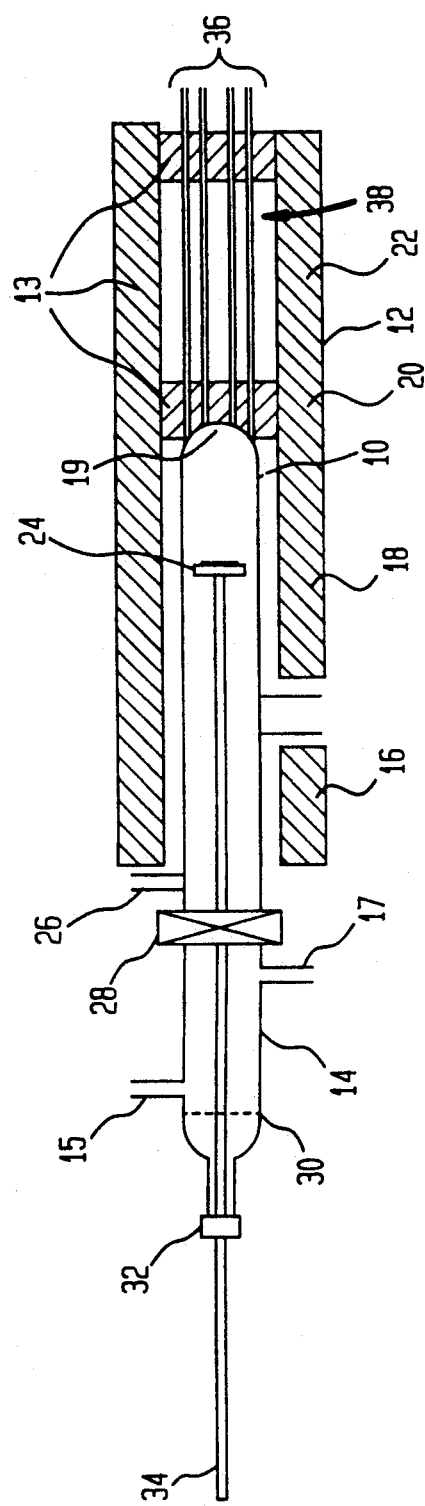
FIG. 1 shows a schematic view of the invention.

Epitaxial growth of the semiconductor layers takes place in the deposition zone, 18. This zone is held at a temperature typically between 500° C. and 750° C.

The preheat zone, 16 is used to preheat a substrate, 24 prior to deposition. Gas mixtures of phosphine ($PH_3$) or arsine ($AsH_3$) in $H_2$ are introduced into this region through inlet, 26 with thru flow rates controlled by commercially available mass is flow controllers.

A loading zone is attached to the reactor and is separated by a pneumatic gate valve, 28. The loading zone includes two pieces attached by a ground joint, 30. The outer piece contains an O-ring sealed feed-through, 32 for the load rod; 34. The loading zone is flushed with $H_2$ after loading to prevent atmospheric gases from entering the reactor. The flush gas is introduced into the chamber through an inlet 15 and exits through an outlet 17.

A gas manifold 36 incorporating a bubbler system including gas input from mass flow controllers is used for the delivery through gas input tubes, 38 of the organometallic precursor(s) into the reactor. Typically, hydrogen gas or an inert gas such as He, Ar, or $N_2$ is used as a carrier for the organometallic. The flow rate of the carrier gas is controlled by electronic mass flow controllers. The temperature of the organometallic compound is maintained at a constant value in a temperature controlled bath. The input partial pressure of the organometallic compound can be adjusted by altering the carrier gas flow rate and/or the bubbler temperature. The gas flows can be switched, mixed, vented, etc. as desired by the use of two-way pneumatic valves or other commercially available gas-switching manifolds.

The delivery of other reactant gases such as phosphine, arsine or dopant gases are also controlled by electronic mass flow containers and can be switched, vented, etc. similarly. All gas switching and control can be microprocessor controlled. These gases are also introduced to the reactor through the gas manifold 36, and travel through the gas input tubes 38 to the mixing zone 20. The gas input tubes are of a narrow diameter of about 0.25" and are made of fused silica and are attached to the fused silica reactor 10. The narrow diameter of these tubes is to ensure rapid injection into the mixing zone 20. The injection region 19, is insulated between regions 20 and 22 to create a sharp transition in temperature at the injection site. The following gas mixtures are injected through separate tubes.

i A mixture of group III organometallic precursors as for example TMI and $H_2$.

ii A mixture of HCl and hydrogen.

iii A mixture of the hydride gases as for example, phosphine and hydrogen.

iv An optional input line for dopant gases.

The injection tubes are maintained at a fourth temperature range below about 200° to 300° C. to prevent the decomposition of TMI, and they are of relatively narrow diameter to ensure a high gas velocity. The high gas velocity is required to prevent the decomposition of TMI at the reactor inlet, before the TMI can react with HCl.

Upon injection, TMI reacts instantly with HCl to form gaseous indium chloride (InCl and methane ($CH_4$)). The forming of InCl by this reaction is the key to avoiding the depletion of In from the gas phase. An inadequate flow of HCl will result in the deposition of metallic indium (or other metal if an alternative OM precursor is used) at the reactor inlet. The InCl subsequently reacts with phosphine (and/or other hydride) in the deposition zone, 18 resulting in the epitaxial growth of InP and the formation of HCl gas as a reaction product. The temperature in the deposition zone, 18 is between 500° and 750° C.

Other organometallic precurbors may be used with similar results. Alternative sources for indium include but are not limited to triethylindium and ethyldimethylindium. Sources for gallium includes trimethylgallium and triethylgallium.

Figure 2:
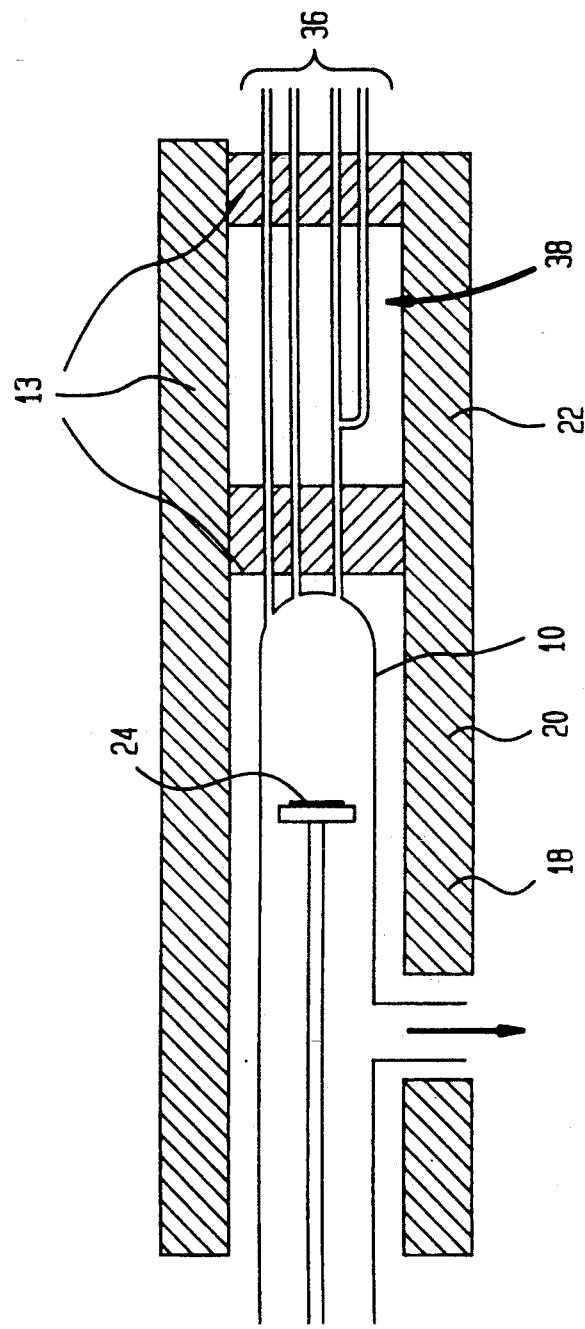
FIG. 2 shows an alternative version of the invention.

In FIG. 2, the organometallic precursors are combined with the $HCl/H_2$ mixture within the zone at a fourth temperature range 22. The two input tubes for the HCl and the organometallic reactants must be joined together in this zone. The temperature in zone, 22 must be high to prevent the condensation of InCl from the vapor phase and low enough to prevent premature decomposition of the organometallic compounds. Typically, this condition can be met by using temperatures in the range of 150° to 300° C., depending on the partial pressures of the reactants. The advantage of this configuration is that a sharp temperature change at the injection site is unnecessary. Also, the temperature of the mixing zone, 20 can be made higher than that of the deposition zone, 18 so that material is not deposited on the reactor walls upstream from the substrate.

According to the invention, the exhaust lines can be connected to vacuum pumps and this process may be performed at reduced pressures. Reduced pressure results in more uniform deposition and more abrupt changes in the composition of deposited films. Moreover, multiple organometallic sources can be used simultaneously to grow ternary, quaternary compounds, etc. The gas flow can be switched, mixed, vented, etc. as desired by the use of two-way pneumatic valves or other commercially available gas switching manifolds in order to grow complex heterostructures needed for advanced, electronic/optoelectronic device structures.

We wish it to be understood that we do not desire to be limited to the exact details of construction as described for obvious modifications will occur to a person skilled in the art.

What is claimed is:

1. Method of growing device quality InP onto an InP substrate using an organometallic precursor in a hot-wall reactor, said method comprising coinjecting into the reactor in a hydrogen carrier gas and then reacting trimethyl indium, (TMI) and HCl, to form gaseous $InCl_4$ and $CH_4$, and then reacting InCl with $PH_3$ to deposit high quality InP epitaxially on the InP substrate, wherein the hot-wall reactor includes a fused silica reactor tube housed in a multiple temperature zone furnace and wherein the reactor also includes a loading chamber and four separate zones including a preheat zone at a first temperature, a deposition zone at a second temperature, a mixing zone at a third temperature and a source zone at a fourth temperature and wherein the mixing zone at a third temperature is modified to serve as an injection region for the reactants, the third temperature varying between 500° C. and 700° C., four narrow injection tubes made of fused silica being attached to the main furnace tube to provide an injection region, the injection region being insulated to create a sharp transition in temperature at the injection site, the following gas mixtures being injected through separate tubes, I. a mixture of (TMI) and hydrogen II. a mixture of HCl and hydrogen, III. a mixture of phosphine and hydrogen and an IV. optional input line for dopant gases, the injection tubes being maintained at a fourth temperature below about 200° to 300° C. to prevent the decomposition of (TMI), and the injection tubes being of relatively narrow diameter to ensure a high gas velocity, the high gas velocity being required to prevent the decomposition of (TMI) at the reactor inlet, before the (TMI) can react with HCl.

2. Method of growing device quality InP onto an InP substrate using an organometallic precursor in a hot-wall reactor, said method comprising coinjecting into the reactor in a hydrogen carrier gas and then reacting trimethyl indium, (TMI) and HCl, to form gaseous InCl and $CH_4$, and then reacting InCl with $PH_3$ to deposit high quality InP epitaxially on the InP substrate, and wherein the hot-wall reactor includes a fused silica reactor tube housed in a multiple temperature zone furnace, and wherein the reactor includes a loading chamber and four separate zones including a preheat zone at a first temperature, a deposition zone at a second temperature, a mixing zone at a third temperature, and a source zone at a fourth temperature and wherein (TMI) is combined with the $HCl/H_2$ mixture within the source zone at a fourth temperature of about 150° to 300° C., the two input tubes for these reactants being joined together in the source zone, and the temperature in the source zone being high enough to prevent the condensation of InCl from the vapor phase, and low enough to prevent premature decomposition of the (TMI).

* * * * *